(12) United States Patent
Manako et al.

(10) Patent No.: US 6,330,135 B1
(45) Date of Patent: Dec. 11, 2001

(54) MAGNETO-RESISTANCE EFFECT ELEMENT BASED ON A FERROMAGNETIC OXIDE THIN FILM ON A STEPPED LAYER OXIDE

(76) Inventors: Takashi Manako, c/o NEC Corporation. 7-1 Shiba 5-chome, Minato-ku; Yoshinori Konishi, c/o Fuji Electric Co., Ltd. 12-1 Yurakucho 1-chome, Chiyoda-ku, both of Tokyo; Masashi Kawasaki; Yoshinori Tokura, both of c/o National Institute for Advanced Interdisciplinary Research, Agency of Industrial Science & Technology, Ministry of International Trade & Industry, 1-4 Higashi 1-chome, Tsukuba-shi, Ibaraki-Ken; Kei-Ichiro Kobayashi, c/o Mitsubishi Electric Corporation 2-3 Marunochi 2-chome, Chiyoda-ku, Tokyo; Makoto Izumi, c/o National Institute for Advanced Interdisciplinary Research, Agency of Industrial Science & Technology, Ministry of International Trade & Industry, 1-4 Higashi 1-chome, Tsukuba-shi, Ibaraki-ken, all of (JP)

( * ) Notice: Subject to any disclaimer, the term of this patent is extended or adjusted under 35 U.S.C. 154(b) by 0 days.

(21) Appl. No.: 09/408,125

(22) Filed: Sep. 29, 1999

(30) Foreign Application Priority Data

Nov. 19, 1998 (JP) ................................................. 10-344861

(51) Int. Cl.$^7$ ..................................................... G11B 5/127
(52) U.S. Cl. .............................................................. 360/313
(58) Field of Search ..................................... 360/313, 324, 360/325; 324/252; 338/32 R (56) References Cited

U.S. PATENT DOCUMENTS 4,586,957 * 5/1986 Masumoto et al. .................... 75/124
4,642,145 * 2/1987 Masumoto et al. ................... 148/336

FOREIGN PATENT DOCUMENTS 64-50575 * 2/1989 (JP).
1-241876 * 9/1989 (JP).

OTHER PUBLICATIONS

Q. LI, et al., Proceedings of the International Magnetics Conference, p. AC–01 "Giant Magnetoresistance in EPI-TAXIAL Nd–Sr–Mn–O Films and other Oxides," April 18, 1995.

H.Y. Hwang, et al., Database Inspec. 'Online!, Institute of Electrical Engineers, vol. 77, An 5373364, "Spin–Polarized Intergrain Tunneling In La/sub 2/3/Sr/sub 1/3MnO/sub 3," Sep. 2, 1996 (Abstract Only).

M. Kawasaki, et al., Database Inspec. 'Online!, Institute of Electrical Engineers, vol. 266, An 4873634, "Atomic Control of the $SrTIO_3$ Crystal Surface," Dec. 2, 1994 (Abstract Only)

R. Shreekala, et al., Database Inspec. 'Online!, Institute of Electrical Engineers, vol. 71, An 5644836, "Effect of Crystallinity on the Magnetoresistance in Perovskite manganese oxide Thin Films,"Jul. 14, 1997 (Abstract Only).

M. Rajeswari, et al., Database Inspec. 'Online!, Institute of Electrical Engineers, vol. 73 AN 6076749 "Correlation Between Magnetic Homogeneity, Oxygen Content, and Electrical and Magnetic Properties of Perovskite Manganite Thin Films," Nov. 1998 (Abstract Only).

* cited by examiner

Primary Examiner—David Davis
(74) Attorney, Agent, or Firm—Oblon, Spivak, McClelland, Maier & Neustadt, P.C.

(57) ABSTRACT

A magneto-resistance effect element includes an oxide substrate having on its surface steps of atomic layer level and on the substrate an epitaxially grown ferromagnetic oxide thin film, the thin film formed on the atomic layer level steps having an antiphased domain boundary.

10 Claims, 5 Drawing Sheets

MAGNETO-RESISTANCE EFFECT ELEMENT BASED ON A FERROMAGNETIC OXIDE THIN FILM ON A STEPPED LAYER OXIDE

BACKGROUND OF THE INVENTION

1. Field of the Invention

This invention relates to a magneto-resistance effect element that has high magnetic sensitivity and is effective as a magnetic sensor for detecting weak magnetic fields.

2. Description of the Prior Art

A compact magnetic sensor capable of detecting weak magnetic fields is indispensable for the realization of the next-generation of high-density magnetic recording devices. Heads using the magneto-resistance (MR) effect of a metal or metal alloy (MR heads) are recently being used in place of the induction-type read heads in wide use up to now. This has enabled reading of high-density magnetically recorded information difficulty to read with an induction-type head.

The metals or alloys used in such heads obviously cannot be used for reading still higher density magnetic recording, however, because the magnitude of their magneto-resistance effects measured in terms of resistance change rate is only about 1%.

Colossal magnetoresistance oxides, which have recently been attracting attention for their ability to provide large magneto-resistance effect, have therefore come under study for use in read heads. As reported at p2041 of *Physical Review Letters*, vol. 77, for example, the large magneto-resistance effect in weak magnetic field (10% or greater) observed at the grain boundary of a polycrystal $La_{1-x}Sr_xMnO_3$, a perovskite exhibiting ferromagnetism, is highly promising for application to high-sensitivity magnetic sensors. A report appearing at p8357 of *Physical Review B*, vol. 54 describes an attempt to utilize the magneto-resistance effect of this perovskite to the utmost by fabricating a so-called tunnel junction element comprised of an insulator film sandwiched between two ferromagnetic films. A magneto-resistance effect of greater than 80% is said to have been obtained.

However, this tunnel junction element has the major drawback of being difficult to fabricate. The reason for this is that the insulator film sandwiched between the ferromagnetic films of the tunnel junction should best be no greater than several nanometers (nm). Fabrication of such a thin insulation film without current shorting is extremely difficult. Moreover, the complexity of the element structure complicates the fabrication process and necessitates sophisticated process optimization. These problems can be assumed to become more pronounced with decreasing element size. Application of the tunnel junction element to a head for reading high-density magnetically recorded information is therefore thought to be quite difficult.

On the other hand, recent breakthroughs in thin oxide thin film growth technology have made it possible to obtain good quality epitaxially grown thin films of oxide that exhibit perfect lattice matching with the substrate. A report appearing at p1540 of *Science*, vol. 266, for example, points out that even if an atomic-scale level difference (step) should be present on the substrate surface owing to the crystallographic structure (crystal structure) of the substrate, the thin film will continue to grow while maintaining the stepped condition. Depending on the crystal structure of the grown thin film and the film growth conditions at this time, portions other than that directly above the step are perfectly monocrystalline while only the step portion is formed thereon with a film whose atomic arrangement exhibits disorderly periodicity in directions parallel to the thin film surface, namely, a film having a so-called antiphased domain boundary. The presence of an antiphased domain boundary is, however, undesirable in the field of compound semiconductors because it causes carrier scattering and boundary surface levels.

An object of this invention is to provide a magneto-resistance effect element that has a high magnetic sensitivity of not less than 50%, is easy to fabricate, and can be effectively used as a magnetic sensor for detecting weak magnetic fields.

SUMMARY OF THE INVENTION

For achieving this object, this invention provides a magneto-resistance effect element comprising an oxide substrate having on its surface steps of atomic layer level and on the substrate an epitaxially grown ferromagnetic oxide thin film, the thin film formed on the atomic layer level steps having an antiphased domain boundary.

In one aspect of the invention, the ferromagnetic oxide thin film is one represented by the formula $RE_{3-x}AE_xMn_2O_7$, where RE is at least one rare earth element selected from the group consisting of Y, La, Ce, Pr, Nd, Sm, Eu, Gd, Tb, Dy, Ho, Er, Tm, Yb and Lu, AE is at least one alkaline earth metal selected from the group consisting of Mg, Ca, Sr and Ba, X is 0–3, and the oxide substrate is a <100> substrate of $SrTiO_3$.

In another aspect of the invention, the ferromagnetic oxide thin film is one represented by the formula $AE_{2-x}RE_xFeMO_6$, where RE is at least one rare earth element selected from the group consisting of Y, La, Ce, Pr, Nd, Sm, Eu, Gd, Tb, Dy, Ho, Er, Tm, Yb and Lu, AE is at least one alkaline earth metal selected from the group consisting of Mg, Ca, Sr and Ba, M is Mo or Re, X is 0–2, and the oxide substrate is a <111> substrate of $SrTiO_3$.

When a ferromagnetic oxide thin film is epitaxially grown on an oxide substrate having atomic layer level steps on its surface in the foregoing manner, an antiphased domain boundary is formed in the thin film directly above the substrate steps and a large magneto-resistance effect is observed when the electrical resistance is measured in the direction perpendicular to the antiphased domain boundary.

When a <100> substrate of $SrTiO_3$ is used as the oxide substrate, the effect of the invention is maximized by conducting a chemical surface treatment that defines the atomic layer at the outermost surface of the substrate as $TiO_2$. When a <111> substrate of $SrTiO_3$ is used as the oxide substrate, good effect is obtained when the formation of the film of $AE_{2-x}RE_xFeMO_6$ is preceded by forming as a buffer a $SrFeO_3$ thin film ending with a $FeO_2$ surface.

The above and other features of the present invention will become apparent from the following description made with reference to the drawings.

DESCRIPTION OF THE PREFERRED EMBODIMENTS

The inventors grew a ferromagnetic oxide thin film on an oxide substrate having steps of atomic layer level on its surface so as to form an antiphased domain boundary in the thin film directly above the substrate steps. Upon measuring the electrical resistance in the direction perpendicular to the formed boundary, they discovered the presence of a large magneto-resistance effect. The present invention was achieved based on this discovery.

The inventors investigated combinations of ferromagnetic oxide materials and oxide substrates capable of producing the aforesaid magnetic effect. It was found that when the ferromagnetic oxide material used is one represented by the formula:

$RE_{3-x}AE_xMn_2O_7$, where RE is at least one rare earth element (at least one of Y, La, Ce, Pr, Nd, Sm, Eu, Gd, Tb, Dy, Ho, Er, Tm, Yb and Lu), AE is at least one alkaline earth metal (at least one of Mg, Ca, Sr and Ba), and X is in the range of 0 to 3, a <100> substrate of $SrTiO_3$ can be used as the oxide substrate having atomic layer steps on its surface.

It was further found that when the ferromagnetic oxide material used is one represented by the formula:

$AE_{2-x}RE_xFeMO_6$, where RE is at least one rare earth element (at least one of Y, La, Ce, Pr, Nd, Sm, Eu, Gd, Tb, Dy, Ho, Er, Tm, Yb and Lu), AE is at least one alkaline earth metal (at least one of Mg, Ca, Sr and Ba), M is Mo or Re and X is in the range of 0 to 2, a <111> substrate of $SrTiO_3$ can be used as the oxide substrate having atomic layer steps on its surface.

There will now be explained an example of using $Sr_2FeMoO_6$ (i.e., $AE_{2-x}RE_xFeMO_6$ where AE=Sr, M=Mo, X=0) as the ferromagnetic oxide material in combination with a <111> substrate of $SrTiO_3$ as the oxide substrate having atomic layer steps on its surface.

Figure 1:
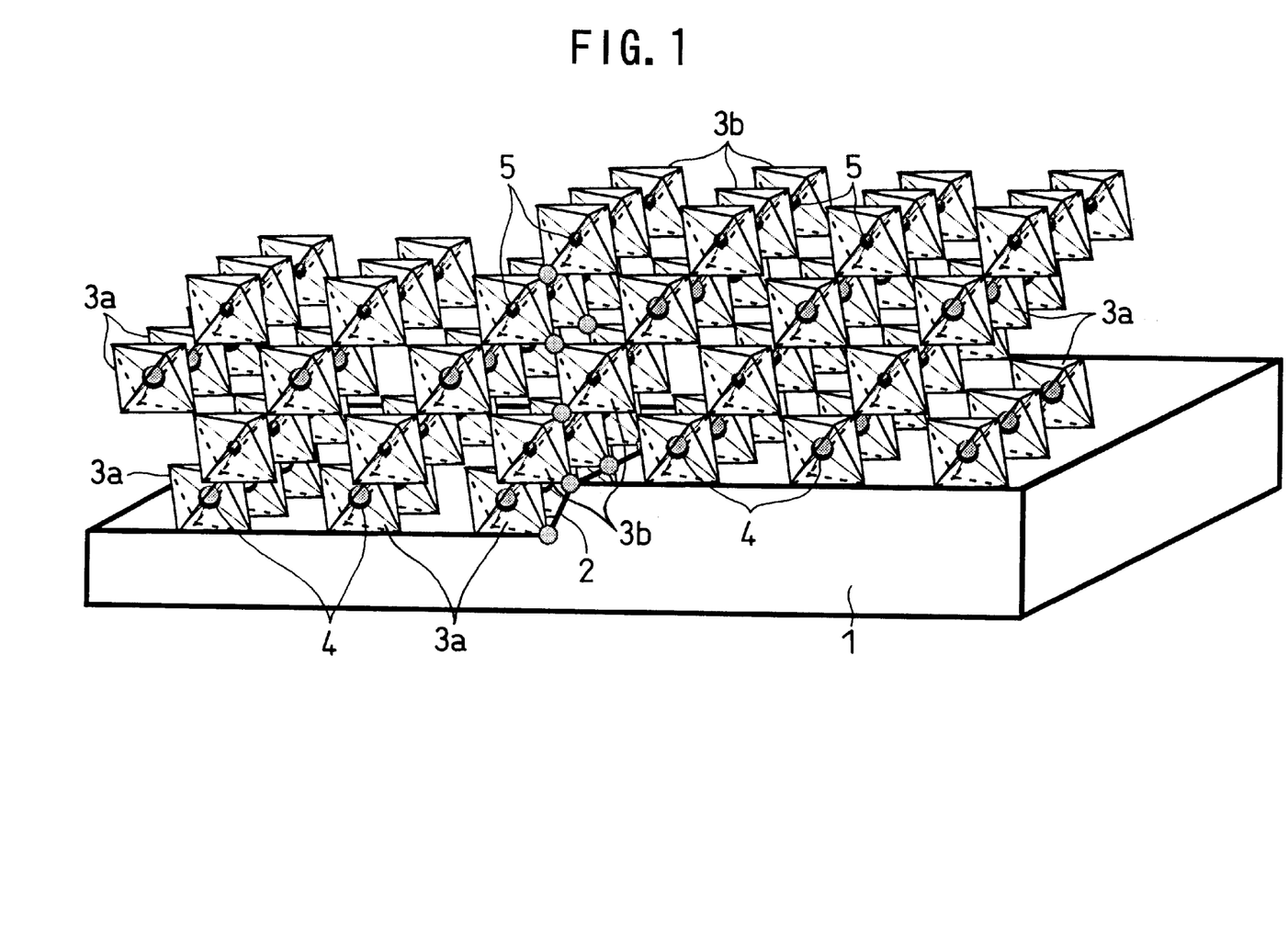
FIG. 1 is a perspective view conceptually showing a portion of an element according to the invention in the vicinity of its antiphased domain boundary.

FIG. 1 is a schematic view of the vicinity where an antiphased domain boundary is observed in the $Sr_2FeMoO_6$. Octahedrons 3a are composed of $Fe_6$ and have iron atoms 4 represented as large black spheres located at their centers. Octahedrons 3b are composed of $MoO_6$ and have molybdenum atoms 5 represented as small black spheres located at their centers. In the ideal crystal structure, the octahedrons 3a having the iron atoms 4 at their centers and the octahedrons 3b having the molybdenum atoms 5 at their centers are arranged alternately in three-dimensional space. The regularity of the atomic arrangement is, however, disrupted at the gray circles indicated at the step portion 2 of the substrate 1, where the octahedrons 3b having the molybdenum atoms 5 are adjacent to each other. The height of the step is equal to the lattice unit cell length of the crystal.

Figure 2:
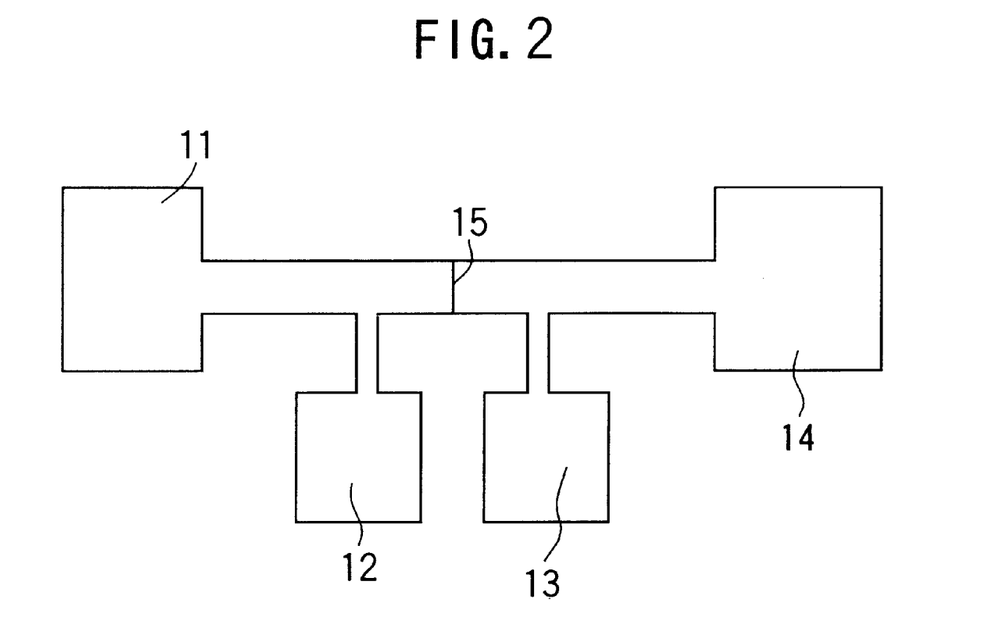
FIG. 2 is a plan view schematically illustrating a four-terminal resistance element that is an example of a magnetic sensor according to the present invention.

As shown in FIG. 1, the arrangement of the iron atoms and the molybdenum atoms of the $Sr_2FeMoO_6$ thin film epitaxially grown on the <111> surface of the $SrTiO_3$ shifts at the portion directly above the substrate step 2. Specifically, the (Fe—O—Mo—O—) chain of the ideal crystal structure breaks down over the boundary surface to form an antiphased domain boundary of Fe—O—Fe or Mo—O—Mo arrangement. The reason for this is that in the $Sr_2FeMoO_6$, which consists of layers containing only Fe atoms and layers containing only Mo atoms stacked alternately in the <111> direction, the distance between the surfaces of layers comprising the same type of atoms is about 0.46 nm, while the height of the step of the $SrTiO_3$ substrate is half this period, i.e., about 0.23 nm. As shown in FIG. 2, this thin film is photolithographically processed to form electrodes 11 and 14 for current application at opposite ends of the thin film, with the antiphased domain boundary 15 located therebetween, and to provide electrodes 12 and 13 for measuring electrical resistance midway of the thin film, with the antiphased domain boundary 15 located therebetween, thus forming a resistance measurement pattern enabling the electrical resistivity to be measured with the direction of the current oriented perpendicular to the substrate step.

$Sr_2FeMoO_6$ is a ferrimagnetic substance whose Fe spins all have the same orientation in the ideal crystal. In the thin film of this example, however, the aforesaid disrupted arrangement of the iron atoms and molybdenum atoms causes the direction of magnetization to be reversed on opposite sides of the boundary surface. Since the conduction electron spin in this ferromagnetic material exhibits exceptionally strong polarization (substantially 100% at low temperatures near that of liquid helium, 60–70% at 300K), the electric resistance of the boundary surface is maximum in this state. The direction of the magnetization on opposite sides of the boundary surface can be made the same by applying a magnetic field of some several tens of Gauss to the device. When this is done, the electrical resistance at the boundary surface decreases to become minimum when the magnetization directions become exactly the same on both sides. By optimizing the film forming conditions, this resistance change rate can be made greater than 50% under a magnetic field of 100 Gauss or less.

The aforesaid magneto-resistance effect can also be obtained with an element using $RE_{3-x}AE_xMn_2O_7$ as the ferromagnetic oxide material and a <100> substrate of $SrTiO_3$ as the oxide substrate.

Next there will be explained examples of methods of producing an oxide substrate having steps of atomic layer level on its surface.

The <111> surface of $SrTiO_3$ can be formed with steps of a height equal to the lattice unit cell length of the crystal (0.4 nm) by annealing a substrate cut in the <111> direction for 2 h at about 1000° C. in a stream of Ar gas.

The <100> surface of $SrTiO_3$ can be formed with atomic layer steps by heat-treating a substrate cut in the <100> direction for 10 min at 800° C. in a 1 mTorr oxygen atmosphere.

The <111> substrate of $SrTiO_3$ formed with steps in the foregoing manner is preferably overlaid with $SrFeO_3$ or $SrMoO_3$ before forming the ferromagnetic oxide thin film. This ensures that when formation of the $Sr_2FeMoO_6$ film is begun the first film to adhere will be the one not composed of the atom applied beforehand and therefore ensures that an antiphased domain boundary is formed at each step portion.

When steps are formed on the <100> surface of $SrTiO_3$, the outermost surface assumes a complex arrangement. However, by conducting a chemical surface treatment to define the atomic layer at the outermost surface of the substrate as $TiO_2$, there can be obtained a substrate formed only with steps of a height equal to the lattice unit cell length of the crystal.

Molecular beam epitaxy, pulsed laser deposition or any other film forming method capable of forming a thin film that is flat at the atomic level can be used as the method for forming the ferromagnetic oxide thin film on the oxide substrate whose surface has been formed with the steps of atomic layer level.

The magneto-resistance effect element according to the present invention can be fabricated by a simple process involving only a single thin film forming step and achieves a high magnetic sensitivity of 50% or higher. It can therefore be effectively used for detection of weak magnetic fields. Owing to its high magnetic sensitivity, the magneto-resistance effect element according to the present invention can be effectively applied as a magnetic sensor for detecting weak magnetic fields. The element can be fabricated by markedly simple processing steps and is therefore adaptable to volume production and can be industrially manufactured with high productivity.

Examples of the invention will now be explained. The invention is, however, not limited to the specific examples described.

EXAMPLE 1

A $SrTiO_3$ substrate cut in the <111> direction was annealed for 2 h at 1000° C. in a stream of Ar gas to obtain a substrate having on its surface parallel atomic layer steps reflecting the slight deviation of the substrate cut surface from the <111> direction.

A thin film of $SrFeO_3$ was formed on the substrate to a thickness of 40 Å by laser ablation. This thickness is equivalent to 10 $SrFeO_3$ crystal unit cell periods.

The laser ablation target was a 20 mm-diameter, 5 mm-thick pellet formed from an oxide polycrystal composed of $SrFeO_3$. The target and the substrate were placed opposite each other in a vacuum chamber and the target was irradiated with a focused beam from a pulsed KrF excimer laser to grow a thin film of $SrFeO_3$ on the substrate as a buffer.

The temperature of the substrate at this time was 900° C. and the oxygen partial pressure in the chamber was $1\times10^{-6}$ Torr. The energy density of the excimer laser beam at the target surface was 1000 mJ/cm$^2$ per pulse and the pulse cycle period was 5 Hz.

The $SrFeO_3$ target was then replaced with a $Sr_2FeMoO_6$ target and a thin film was grown in a similar manner, under growth conditions of a substrate temperature of 930° C., an oxygen partial pressure of $1\times10^6$ Torr, a laser power of 1000 mJ/cm$^2$ per pulse and a pulse cycle period of 5 Hz. The thickness of the $Sr_2FeMoO_6$ film was approximately 500 Å. The film obtained was processed into a four-terminal resistance measurement element such as shown in FIG. 2 by ordinary photolithography. The element thus obtained was approximately 20 μm in width. The distance between the electrodes 11 and 14 was about 50 μm. The element was patterned so that the direction of current flow ((11)–(14) in the drawing) would be perpendicular to the direction of the step edge on the $SrTiO_3$ substrate ((12)–(13) in the drawing).

Figure 3:
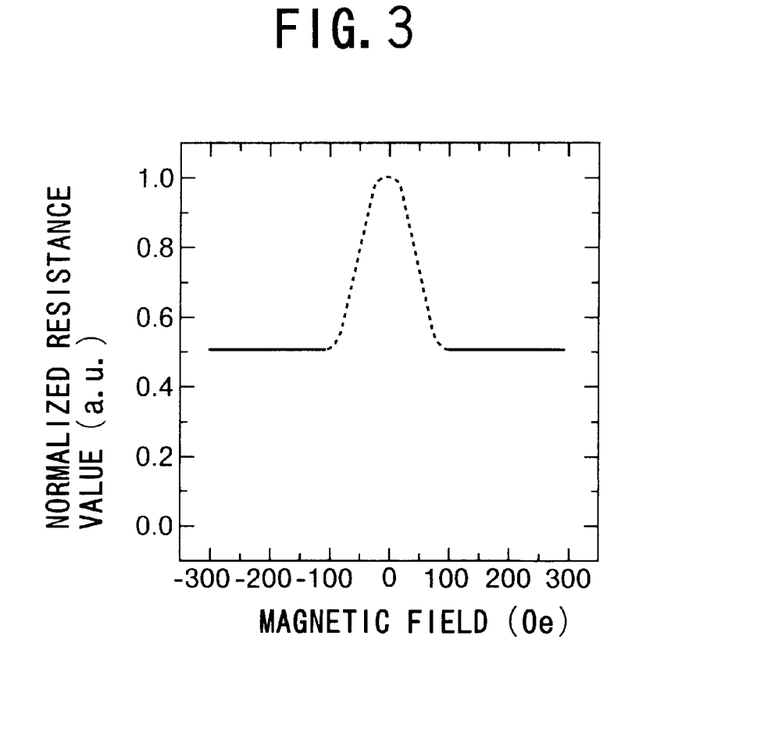
FIG. 3 is a graph showing how the electrical resistance of an invention magnetic sensor using $Sr_2FeMoO_6$ varies as a function of applied magnetic field intensity.

The magneto-resistance effect of the element was evaluated. The element was placed inside an electromagnet and the intensity of the magnetic field inside the electromagnet was varied while current of 10 μA was being applied between the electrodes 11 and 14 so as to pass perpendicularly to the antiphased domain boundary 15. The change in the electrical resistance of the element with change in magnetic field intensity was calculated from the change in measured voltage between the electrodes 12 and 13. The magneto-resistance determined at 27° C. is shown in FIG. 3.

The electrical resistivity of the element was maximum when no magnetic field was applied. Upon application of a magnetic field, the electrical resistivity decreased with increasing magnetic field intensity until falling to about 50% of the maximum value at a field intensity of 100 Gauss.

EXAMPLE 2

A thin film of $SrFeO_3$ was formed as a buffer on a <111> substrate of $SrTiO_3$ provided with atomic layer steps by surface-processing in the manner of Example 1.

The $SrFeO_3$ target was then replaced with a compound sintered body composed of $Sr_2FeReO_6$ and a thin film of $Sr_2FeReO_6$ was deposited to a thickness of 500 Å under conditions of a substrate temperature of 850° C., an oxygen partial pressure of $1\times10^{-6}$ Torr, an excimer laser beam energy density of 1000 mJ/cm$^2$ per pulse and a pulse cycle period of 5 Hz.

A four-terminal resistance measurement element was fabricated in the manner of Example 1 and the magneto-resistance effect at 27° C. was measured. The decrease in resistance was found to be 60% at 100 Gauss.

EXAMPLE 3

A thin film of $SrFeO_3$ was formed as a buffer on a <111> substrate of $SrTiO_3$ provided with atomic layer steps by surface-processing in the manner of Example 1.

The $SrFeO_3$ target was then replaced with a compound sintered body composed of $Sr_{1.8}La_{0.2}FeMoO_6$ and a thin film of the same composition was deposited to a thickness of 500 Å under conditions of a substrate temperature of 930° C., an oxygen partial pressure of $1\times10^{-6}$ Torr, an excimer laser beam energy density of 1000 mJ/cm$^2$ per pulse and a pulse cycle period of 5 Hz.

A four-terminal resistance measurement element was fabricated in the manner of Example 1 and the magneto-resistance effect at 27° C. was measured. The decrease in resistance was found to be 55% at 100 Gauss.

Figure 4:
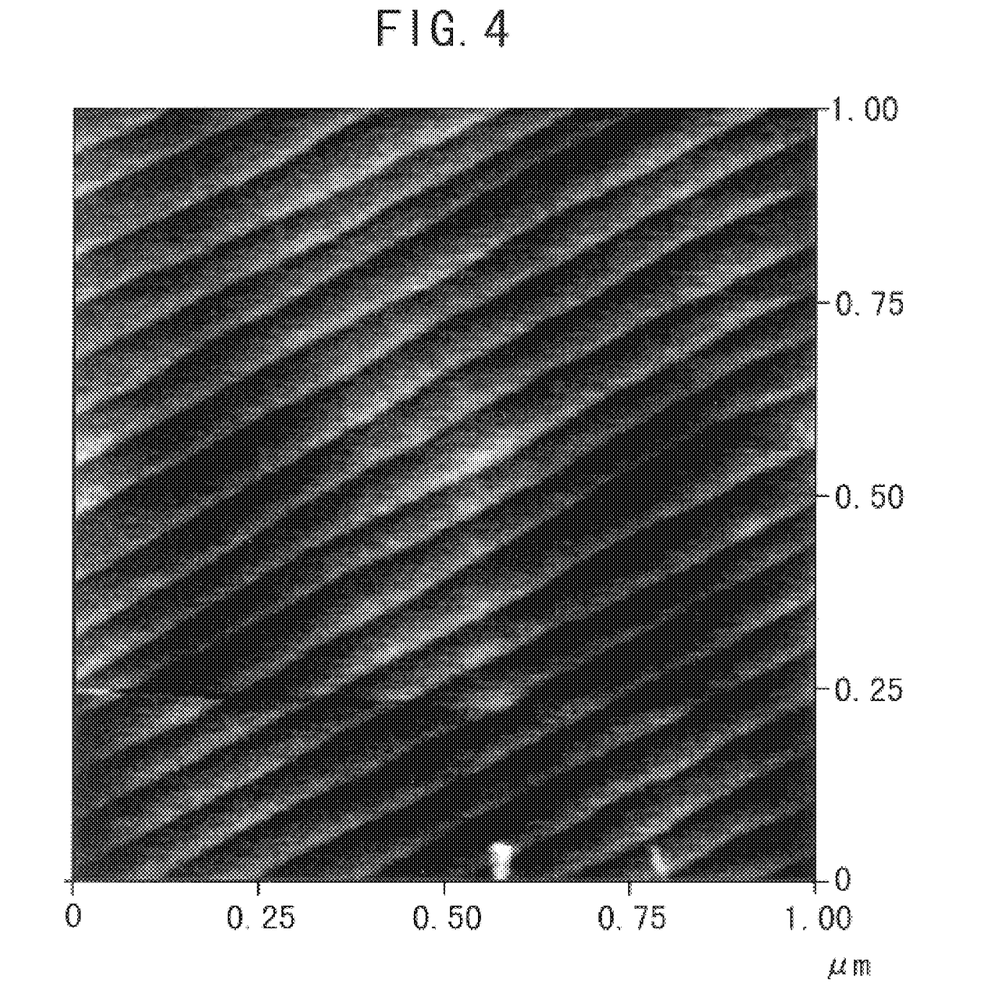
FIG. 4 is an image taken with an atomic force microscope of the surface of a $SrTiO_3$ substrate used in an example of the present invention.

Example 4 A $SrTiO_3$ substrate cut in the <100> direction was etched using a mixed solution of $NH_4$—HF of pH4.2, introduced into a vacuum chamber and heat-treated for 10 min at 800° C. in a 1 mTorr oxygen atmosphere to coat the entire atomic layer at the outermost surface with a $TiO_2$ surface and obtain a substrate having on its surface parallel atomic layer steps reflecting the slight deviation of the substrate cut surface from the <100> direction. An image of the surface of the substrate taken with an atomic force microscope is shown in FIG. 4. From FIG. 4 it can be seen that the direction of the step edge was inclined approximately 30 degrees and the step interval was approximately 60 nm. The step interval is determined by the substrate OFF angle and can be regulated as desired. Since the magneto-resistance is produced at the step position, the magnitude of the magneto-resistance can be regulated by regulating the step interval.

A thin film of $La_{1.2}Sr_{1.8}Mn_2O_7$ was formed on the substrate to a thickness of 100 Å by laser ablation. This thickness is equivalent to 10 $La_{1.2}Sr_{1.8}Mn_2O_7$ crystal unit cell periods.

The laser ablation target was a 20 mm-diameter, 5 mm-thick pellet formed from an oxide polycrystal composed of $La_{1.2}Sr_{1.8}Mn_2O_7$. The target and the substrate were placed opposite each other in a vacuum chamber and the target was irradiated with a pulsed KrF excimer laser beam to grow a thin film of $La_{1.2}Sr_{1.8}Mn_2O_7$ on the substrate. The temperature of the substrate at this time was 970° C. and the oxygen pressure in the chamber was 100 mTorr. The energy density of the excimer laser beam at the target surface was 2000 mJ/cm$^2$ per pulse and the pulse cycle period was 10 Hz.

Figure 5:
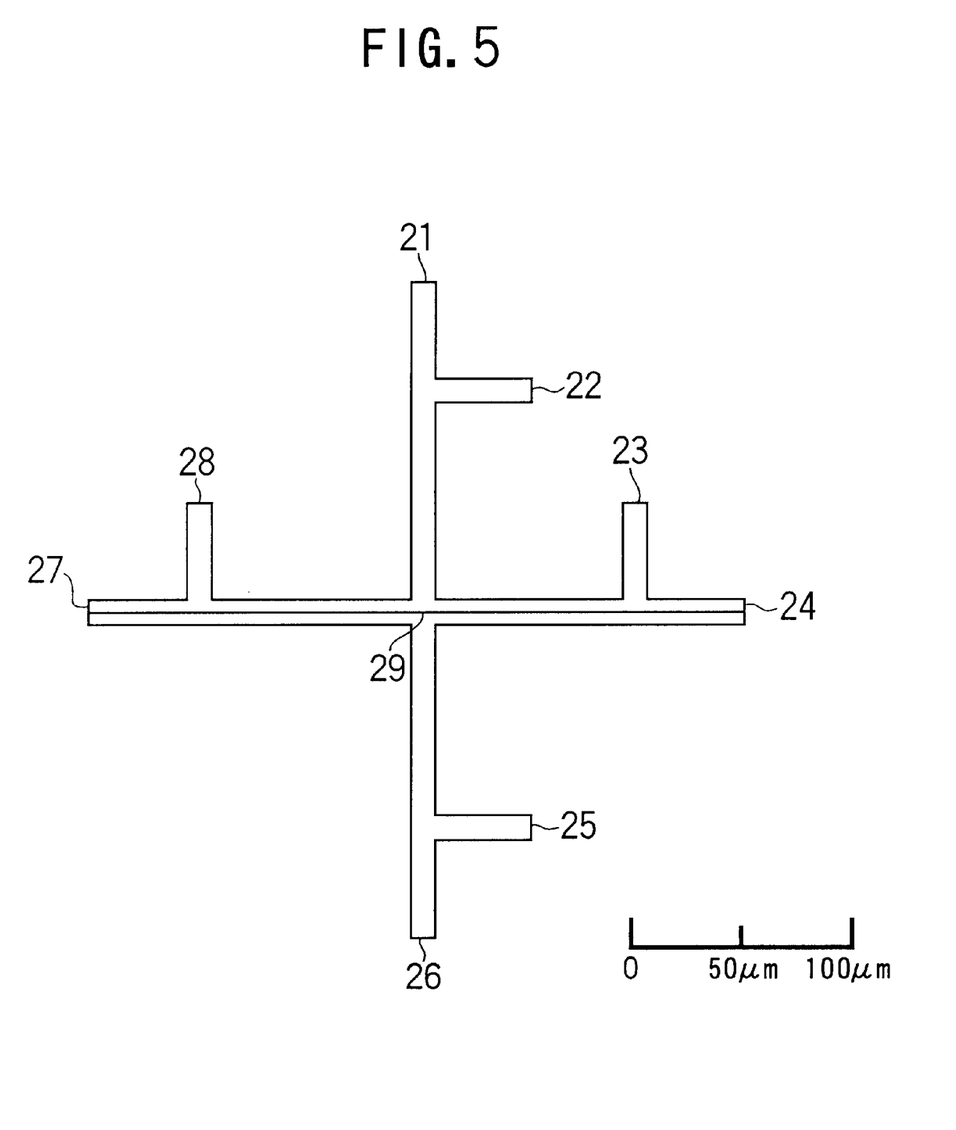
FIG. 5 is plan view schematically illustrating a four-terminal element for measuring magneto-resistance anisotropy (a type of magnetic sensor) used in the fourth example of the present invention.
Figure 6:
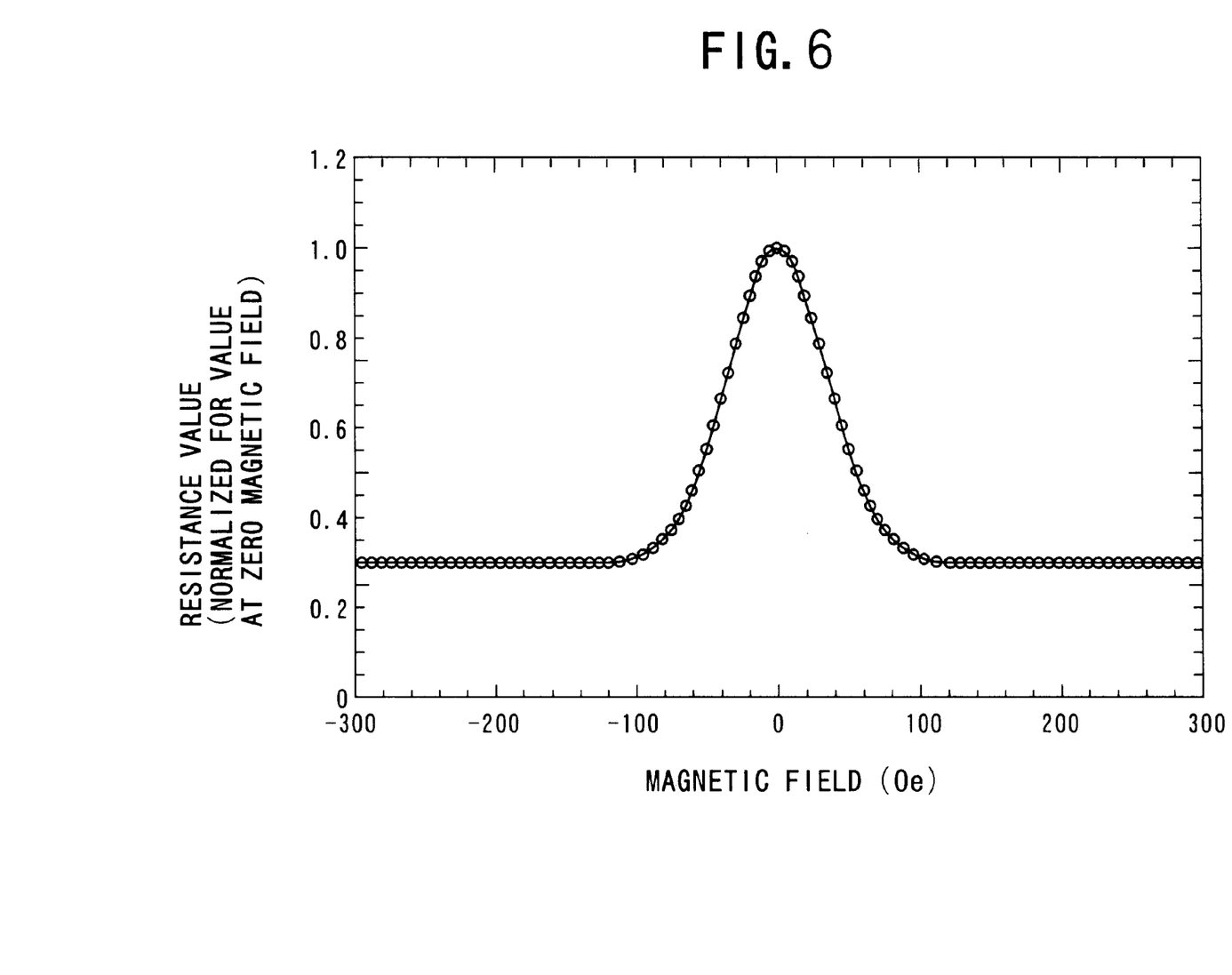
FIG. 6 is a graph showing an example of how the resistivity of the magnetic sensor used in the fourth example of the present invention varied as a function of magnetic field intensity.

The film obtained was processed into a four-terminal resistance measurement element such as shown in FIG. 5 by ordinary photolithography. The element was patterned so that direction of current flow would be perpendicular to the direction of the step edge 29 on the $SrTiO_3$ substrate. Specifically, after film formation, the direction of the step edge was first confirmed with an atomic force microscope (AFM). Photoresist patterning was then conducted so that the step edge direction was a direction (21–26) and the direction straddling the step edge was a direction (24–27). The film could be readily etched using hydrochloric acid or aqua regia. The photoresist was then dissolved and removed with acetone to complete fabrication of the element. Reference numeral 29 in FIG. 5 indicates the antiphased domain boundary. The magneto-resistance effect of the element was evaluated. The element was placed inside an electromagnet and the intensity of the magnetic field inside the electromagnet was varied while current was being applied between electrodes 22 and 25. The change in the electrical resistance of the element with change in magnetic field intensity was calculated from the change in measured voltage between electrodes 23 and 28. The magneto-resistance determined at −200° C. is shown in FIG. 6. The electrical resistivity of the element was maximum when no magnetic field was applied. Upon application of a magnetic field, the electrical resistivity decreased with increasing magnetic field intensity until falling to about 30% of the maximum value at a field intensity of 100 Gauss.

What is claimed is:

1. A magneto-resistance effect element comprising:

a <100> substrate of $SrTiO_3$ that has a surface formed with steps of atomic layer level; and a ferromagnetic oxide thin film epitaxially grown on said substrate;

said thin film being formed on the atomic layer level steps having an antiphased domain boundary, and being represented by the formula $RE_{3-x}AE_xMn_2O_7$, where RE is at least one rare earth element selected from the group consisting of Y, La, Ce, Pr, Nd, Sm, Eu, Gd, Tb, Dy, Ho, Er, Tm, Yb and Lu, AE is at least one alkaline earth metal selected from the group consisting of Mg, Ca, Sr and Ba, and x is 0 to 3.

2. A magneto-resistance effect element according to claim 1, wherein the surface of the <100> substrate of $SrTiO_3$ is subjected to a chemical surface treatment to make it a $TiO_2$ surface.

3. A method of detecting a magnetic field comprising detecting a magnetic field with the magneto-resistance effect element of claim 1.

4. A method of reading high density magnetically recorded information comprising reading magnetically recorded information with a compact magnetic sensor containing a head comprised of the magneto-resistance effect element of claim 1.

5. A process for manufacturing the magneto-resistance effect element of claim 1 comprising annealing an oxide substrate upon which two oxide layers are formed by laser ablation then patterning by photolithography.

6. A magneto-resistance effect element comprising:

a <111> substrate of $SrTiO_3$ that has a surface formed with steps of atomic layer level; and, a ferromagnetic oxide thin film epitaxially grown on said substrate;

said thin film being formed on the atomic layer level steps having an antiphased domain boundary, and being represented by the formula $AE_{2-x}RE_xFeMO_6$, where RE is at least one rare earth element selected from the group consisting of Y, La, Ce, Pr, Nd, Sm, Eu, Gd, Tb, Dy, Ho, Er, Tm, Yb and Lu, AE is at least one alkaline earth metal selected from the group consisting of Mg, Ca, Sr and Ba, M is Mo or Re, X is 0–2.

7. A magneto-resistance effect element according to claim 6, wherein a thin film of $SrFeO_3$ is deposited on the surface of the <111> substrate.

8. A method of detecting a magnetic field comprising detecting a magnetic field with the magneto-resistance effect element of claim 6.

9. A method of reading high density magnetically recorded information comprising of reading magnetically recorded information with a compact magnetic sensor containing a head comprised of the magneto-resistance effect element of claim 6.

10. A process for manufacturing the magneto-resistance effect element of claim 6 comprising annealing an oxide substrate upon which two oxide layers are formed by laser ablation then patterning by photolithography.

* * * * *

UNITED STATES PATENT AND TRADEMARK OFFICE
CERTIFICATE OF CORRECTION

PATENT NO. : 6,330,135 B1  
DATED : December 11, 2001  
INVENTOR(S) : Manako et al.

It is certified that error appears in the above-identified patent and that said Letters Patent is hereby corrected as shown below:

<u>Title page,</u>  
Item [75], the Inventor's information should read:

-- [76] Inventors: Takashi Manako; Yoshinori Konishi, both of Tokyo; Masashi Kawasaki; Yoshinori Tokura, both of Ibaraki-ken; Kei-Ichiro Kobayashi, Tokyo; Makoto Izumi, Ibaraki-ken, all of (JP) --

Signed and Sealed this

Sixteenth Day of September, 2003

JAMES E. ROGAN  
*Director of the United States Patent and Trademark Office*

UNITED STATES PATENT AND TRADEMARK OFFICE
CERTIFICATE OF CORRECTION

PATENT NO.   : 6,330,135 B1  
DATED        : December 11, 2001  
INVENTOR(S)  : Makoto Izumi et al.

It is certified that error appears in the above-identified patent and that said Letters Patent is hereby corrected as shown below:

<u>Title page,</u>
Item [73], Assignee, should read:
-- [73] Assignee: **NEC Corporation; Fuji Electric Co., Ltd.;
Angstrom Technology Partnership; Agency
of Industrial Science & Technology,
Ministry of International Trade & Industry;
Mitsubishi Electric Corporation**; all of Tokyo (JP) --

Signed and Sealed this

Twenty-seventh Day of January, 2004

JON W. DUDAS
*Acting Director of the United States Patent and Trademark Office*